(12) United States Patent
Tsujiuchi

(10) Patent No.: US 8,470,478 B2
(45) Date of Patent: Jun. 25, 2013

(54) SOLID ELECTROLYTE AND ELECTROCHEMICAL ELEMENT

(75) Inventor: Yutaka Tsujiuchi, Akita (JP)

(73) Assignee: Akita University, Akita-shi (JP)

( * ) Notice: Subject to any disclaimer, the term of this patent is extended or adjusted under 35 U.S.C. 154(b) by 0 days.

(21) Appl. No.: 13/576,735

(22) PCT Filed: Feb. 4, 2011

(86) PCT No.: PCT/JP2011/052411
§ 371 (c)(1),
(2), (4) Date: Aug. 2, 2012

(87) PCT Pub. No.: WO2011/096532
PCT Pub. Date: Aug. 11, 2011

(65) Prior Publication Data
US 2012/0301793 A1   Nov. 29, 2012

(30) Foreign Application Priority Data

Feb. 5, 2010 (JP) ................. 2010-024100

(51) Int. Cl.
*H01M 6/14* (2006.01)
(52) U.S. Cl.
USPC ......................................................... 429/300
(58) Field of Classification Search
None
See application file for complete search history.

(56) References Cited

U.S. PATENT DOCUMENTS

| | | | | |
|---|---|---|---|---|
| 5,219,564 A | * | 6/1993 | Zalipsky et al. | 424/78.17 |
| 6,272,385 B1 | | 8/2001 | Bishay et al. | |
| 6,468,657 B1 | * | 10/2002 | Hou et al. | 428/403 |
| 6,835,332 B2 | * | 12/2004 | Yamamoto et al. | 252/519.1 |
| 2003/0165743 A1 | * | 9/2003 | Horikiri et al. | 429/300 |
| 2005/0217722 A1 | | 10/2005 | Komatsu et al. | |
| 2006/0184092 A1 | * | 8/2006 | Atanasoska et al. | 604/20 |

FOREIGN PATENT DOCUMENTS

| | | |
|---|---|---|
| JP | 3-091225 A | 4/1991 |
| JP | 2000-070381 A | 3/2000 |
| JP | 2003-055557 A | 2/2003 |
| JP | 2006-073420 A | 3/2006 |
| JP | 2006-261171 A | 9/2006 |
| JP | 2008-110242 A | 5/2008 |

OTHER PUBLICATIONS

International Search Report mailed Mar. 8, 2011; PCT/JP2011/052411.

* cited by examiner

*Primary Examiner* — Patrick Ryan
*Assistant Examiner* — Jose Colucci Rios
(74) *Attorney, Agent, or Firm* — Ladas & Parry LLP

(57) ABSTRACT

A solid electrolyte which is made of a material having high biocompatibility and which is capable of conducting a large electric current while performing a rectifying function; and an electrochemical element employing the same. The solid electrolyte is formed by stacking a first layer containing an acidic amino acid and a second layer containing a basic amino acid; and the electrochemical element is formed by disposing the solid electrolyte between a positive electrode and a negative electrode.

10 Claims, 14 Drawing Sheets

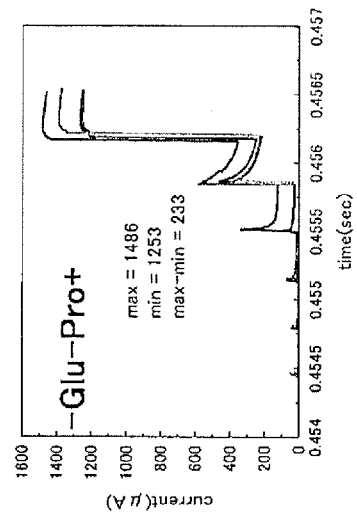
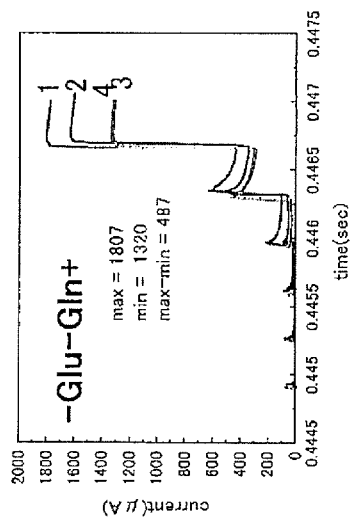
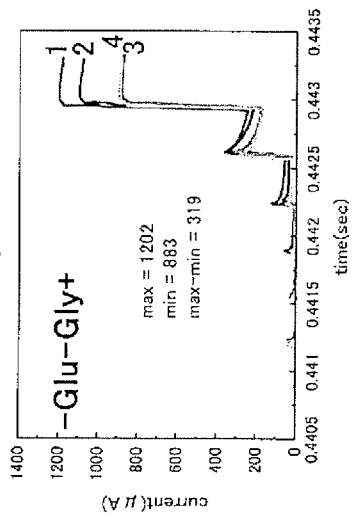
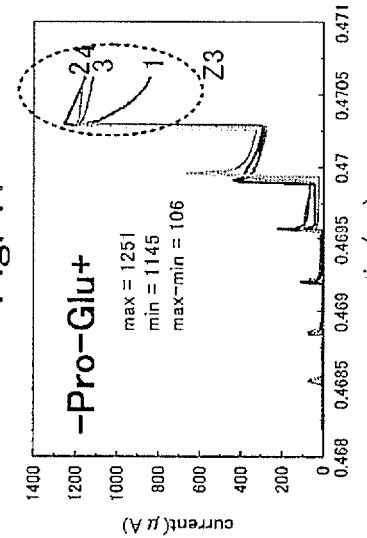
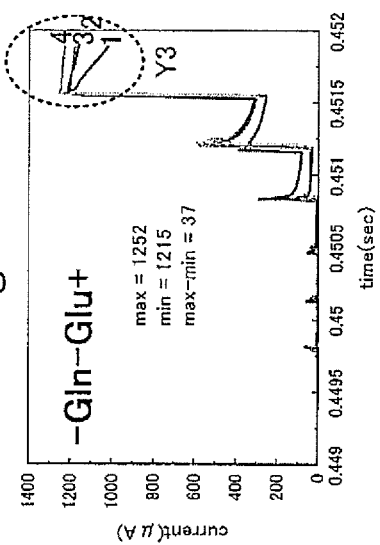
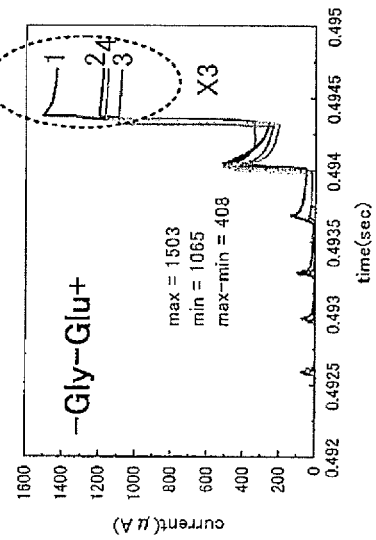

SOLID ELECTROLYTE AND ELECTROCHEMICAL ELEMENT

TECHNICAL FIELD

The present invention relates to a solid electrolyte with ion conductivity which is based on a gelatinous composition containing an amino acid high in biocompatibility; and an electrochemical element employing the solid electrolyte.

BACKGROUND ART

An organic gel having excellent ion conductivity has been used as a solid electrolyte in various electrochemical elements and chemical devices such as a secondary battery and a capacitor. For example, as described in Patent Document 1, it is known that by employing a gelatinous composition formed of an oligomer having a hydrosilyl group and a cross-linking agent having three or more double bond groups, it is possible to obtain an electrochemical element having both high structural stability with three-dimensional cross-linkage and excellent ion conductivity.

Further, organic ion-conducting materials and electrically conductive materials have also been used in a circuit part in a chemical device such as a so-called organic EL. For example, as described in Patent Document 2, there have been developed various kinds of organic diodes having a pn junction formed by an organic semiconductor material and having a rectifying function. In this way, various kinds of organic ion conductors and organic electrical conductors have been developed in order to improve the performance of the electrochemical elements and chemical devices.

The organic ion conductors and organic electrical conductors are also used in the medical field. For example in Patent Documents 3 and 4, at a time of using an electrode pad for a defibrillator and the like on a patient, a conductive organic gel is applied on the patient's skin and a necessary large electric current is sent to the patient via the organic gel. In Patent Documents 3 and 4, RG63T is used as the conductive organic gel; and with such a material, a large electric current necessary for defibrillation can be sent to the heart in the body quickly in a very short time.

CITATION LIST

Patent Literature

Patent Document 1: Japanese Patent Application Laid-Open (JP-A) No. 2003-55557
Patent Document 2: JP-A No. 2006-261171
Patent Document 3: JP-A No. 2000-70381
Patent Document 4: JP-A No. 2008-110242

SUMMARY OF THE INVENTION

Problems to be Solved by the Invention

The above described conventional art does not at all consider using a biocompatible material in the ion conducting organic gel. Especially in view of the possibility that the conductive organic gel touches the human body directly as disclosed in Patent Documents 3 and 4, it is considered preferable to use as a constituent material of the organic gel, a material which is high in biocompatibility and safe to the human body. In Patent Documents 3 and 4, as it is possible to finish using the organic gel in a very short time, there will not be a big problem in terms of safety. Nonetheless, in order to send an electric current to the living body for a longer period of time for medical purposes, it is indeed desirable to use a material having high biocompatibility. Further, in cases where an organic material is used in a rectifying circuit as in an organic diode disclosed in Patent Document 2, by employing an organic diode made of a material having excellent biocompatibility, it is further possible to provide an apparatus (for example a medical apparatus) that is highly safe to the living body.

Accordingly, an object of the present invention is to provide: a solid electrolyte which is made of a material having high biocompatibility and which is capable of conducting a large electric current while performing a rectifying function; and an electrochemical element employing the same.

Means for Solving the Problems

To solve the above problems, the present invention takes the following configurations.

A first aspect of the present invention is to provide a solid electrolyte which is formed by stacking a first layer containing an acidic amino acid and a second layer containing a basic amino acid; thereby the above problems are solved.

Here, the "solid electrolyte" in the present application refers to not only an electrolyte that is completely solid but also an electrolyte which can keep its shape without using a container or the like. From such a viewpoint, in the first aspect of the present invention both the first layer and the second layer are preferably gelatinous. By making the first and second layers gelatinous, it is possible to make a solid electrolyte which has improved ion conductivity and excellent formability; and the solid electrolyte can be produced easily. For example, the solid electrolyte can be produced and used on site in a medical setting.

In the first aspect of the present invention, the acidic amino acid is preferably asparagine acid or glutamic acid. This is because it is possible to make a solid electrolyte which can maintain biocompatibility and can further conduct a large electric current while performing a rectifying function.

In the first aspect of the present invention, the basic amino acid is preferably arginine or lysine. This is because it is possible to make a solid electrolyte which can maintain biocompatibility and can further conduct a large electric current while performing a rectifying function.

In the first aspect of the present invention, the solid electrolyte preferably contains sugar and/or cellulose in addition to the amino acid. This is because it is possible to make a solid electrolyte which has higher biocompatibility.

A second aspect of the present invention is to provide an electrochemical element which is formed by disposing between a positive electrode and a negative electrode, a solid electrolyte formed by stacking a first layer containing an acidic amino acid and a second layer containing a basic amino acid; thereby the above problems are solved.

In the second aspect of the present invention, both the first layer and the second layer are preferably gelatinous. By making the first and second layers gelatinous, it is possible to make a solid electrolyte which has improved ion conductivity and excellent formability; and the solid electrolyte can be easily produced. Therefore, it is possible to make an electrochemical element with excellent industrial productivity.

In the second aspect of the present invention, it is preferable to disposed the first layer on the negative electrode side and to dispose the second layer on the positive electrode side. This is because it is possible to make an electrochemical element which can further conduct a large current.

In the second aspect of the present invention, the acidic amino acid is preferably asparagine acid or glutamic acid. This is because it is possible to make an electrochemical element which can maintain biocompatibility and can further conduct a large electric current while performing a rectifying function.

In the second aspect of the present invention, the basic amino acid is preferably arginine or lysine. This is because it is possible to make an electrochemical element which can maintain biocompatibility and can further conduct a large electric current while performing a rectifying function.

In the second aspect of the present invention, the solid electrolyte preferably contains sugar and/or cellulose in addition to the amino acid. This is because it is possible to make an electrochemical element having higher biocompatibility.

Effects of the Invention

According to the present invention, by employing a material such as an amino acid found in a biological system, it is possible to provide: a solid electrolyte which is made of a material having high biocompatibility and which can conduct a large electric current in one direction with a rectifying function; and an electrochemical element using the solid electrolyte.

BRIEF DESCRIPTION OF THE DRAWINGS

FIG. 7 is a view showing electrical characteristics for each case when glutamic acid which is an acidic amino acid and any one of three kinds of neutral amino acids (glutamine (Gln), glycine (Gly) and proline (Pro)) were used to form a two-layer solid electrolyte.

Figure 1:
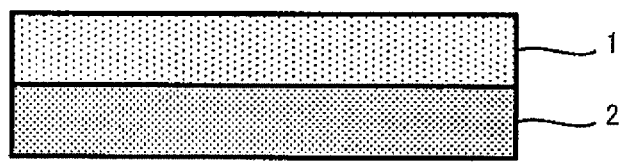
FIG. 1 is a schematic view of the solid electrolyte of the present invention according to one embodiment.

DESCRIPTION OF THE NUMERALS 1 first layer
2 second layer
10 solid electrolyte
11 electrode (negative electrode)
12 electrode (positive electrode)
20 electrochemical element
51 container
52 gel
53 container
54 mold
55 gel body (solid electrolyte)
56 plate electrode
57 plate electrode
58 fixing tape
60 electrochemical element
70 power source
71 variable resistance
72 tester (voltmeter)
73 tester (ammeter)
74 computer
75 computer

MODE FOR CARRYING OUT THE INVENTION

1. Solid Electrolyte

FIG. 1 schematically shows a configuration of the solid electrolyte according to the present invention. As shown in FIG. 1, the solid electrolyte 10 according to the present invention comprises two layers that are a first layer (layer 1) containing an acidic amino acid and a second layer (layer 2) containing a basic amino acid.

The acidic amino acid to be contained in the layer 1 is not particularly restricted as long as it is an acidic amino acid; however, asparagine acid or glutamic acid is especially preferably employed. On the other hand, the basic amino acid to be contained in the layer 2 is not particularly restricted as long as it is a basic amino acid; however, arginine or lysine is especially preferably employed. By employing such acidic amino acids and basic amino acids, it is possible to make a solid electrolyte 10 which is capable of further conducting a large electric current while performing a rectifying function. The content of the amino acid in the layer 1 and the layer 2 is preferably 0.1 to 0.7 mass % and especially preferably 0.3 to 0.5 mass % based on the entire layer. By setting the content of the amino acid in the layer 1 and the layer 2 at 0.01 mol/L or more, it is possible to make a solid electrolyte 10 which functions more properly.

The layers 1 and 2 contain other biological components such as sugar, cellulose, nucleic acid and protein, in addition to the above mentioned acidic amino acid or basic amino acid. Those other biological components to be used in the layers 1 and 2 are not particularly restricted. For example, as for the sugar, polysaccharides may be employed without particular restrictions. Specific examples not only include polysaccharides such as agarose, D-galactose, 3,6-anhydrogalactose, and D-mannose; but also include monosaccharides such as D-glucose, dextrose, glucose, cartose, glucolin, grape sugar, corn sugar, cerelose, fructose, laevosan, laevoral, levugen, levulose, and fruit sugar. The cellulose and other biological components are also not particularly restricted. However, especially when high strength is needed, cellulose which is produced by bacteria such as acetic acid bacteria is preferably employed. Further, in view that the solid electrolyte 10 can be produced more easily, those that can be easily dissolved in a solvent such as water are preferred. The content of the sugar, cellulose and other components in the layers 1 and 2 may be for example set in a range that enables the gelatinous shape to be maintained. For example, the remaining part other than the above amino acid may be constituted by a gel of sugar, cellulose and/or other components. In specific, if the content thereof, to the distilled water, is 1 mass % or more, preferably about 2 to 5 mass %, it is possible to make a gel which has a fixed shape. Constituting the layers 1 and 2 by biological components such as sugar and cellulose in addition to amino acid enables a solid electrolyte 10 which has higher biocompatibility to be made.

The solid electrolyte 10 can be produced for example in the following procedures: a solution formed by mixing and dissolving a predetermined amino acid and sugar and/or cellulose at a predetermined ratio is poured into a mold and the like to be gelated and shaped, thereby preparing the layers 1 and 2 individually; then the layers 1 and 2 are stacked with each other, thereby producing the solid electrolyte 10. More specifically, for example, a solution formed by dissolving an amino acid in distilled water is prepared; while adequately adjusting the pH thereof, sugar and cellulose in a solid powder form are added to the solution to be stirred; the solid powder is dissolved sufficiently by heating or by microwave irradiation; the heated solution is poured into a mold and made into a gel-shaped body by air cooling; and thereby the layers 1 and 2 can be prepared individually. Then the shaped bodies of the layers 1 and 2 are stacked with each other, thereby producing the solid electrolyte 10. Herein, the shape and thickness of the layers 1 and 2 are not particularly restricted. However, in order to make a solid electrolyte 10 which has a sufficient rectifying function and is capable of conducting a large electric current, the thickness of each layer is preferably 100 μm to 5 mm, and especially preferably 500 μm to 2 mm. When adjusting the pH of the solution at the time of preparing each of the layers 1 and 2, the pH, as to the layer 1, is preferably about 2 to 4 and most suitably about 3. As to the layer 2, the pH of the solution is preferably about 11 to 15, and most suitably about 13.

In this manner, the solid electrolyte 10 according to the present invention can be easily produced as a gelatinous body. As such, it is not only excellent in industrial productivity; but also when a solid electrolyte needs to be prepared urgently for example, working staff can easily produce the solid electrolyte 10 on site (for example in a medical setting).

With such configurations as above, the solid electrolyte 10 according to the present invention has high biocompatibility and is capable of conducting a large electric current with a rectifying function. The solid electrolyte 10 can be applied to various kinds of electrochemical elements. For example, it can be used not only for electrochemical elements such as a diode, organic transistor, primary battery, secondary battery, wet solar cell, capacitor, electrochromic device, to be used in a chemiluminescence display device and liquid crystal display device, but also as a pad material for a bioelectrode to be used in a medical setting. Furthermore, since the solid electrolyte 10 according to the present invention has a rectifying function, it can be used in a rectifying circuit in various devices. Hereinafter, one embodiment of the electrochemical element according to the present invention will be described.

2. Electrochemical Element

Figure 2:
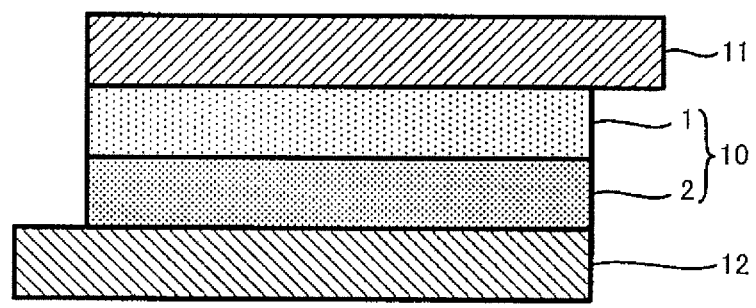
FIG. 2 is a schematic view of the electrochemical element of the present invention according to one embodiment.

FIG. 2 schematically shows a configuration of the electrochemical element 20 of the present invention according to one embodiment. As shown in FIG. 2, the electrochemical element 20 is configured to have the solid electrolyte 10 disposed between a negative electrode 11 and a positive electrode 12, the solid electrolyte 10 comprising two layers that are the first layer (layer 1) containing an acidic amino acid and the second layer (layer 2) containing a basic amino acid.

The constitution of the negative electrode 11 and the positive electrode 12 are not particularly restricted. For example, they may be constituted by an electrode made of a known electrically conductive thin film. In specific, there may be employed various kinds of metal foils, a laminate film formed by vapor-depositing the metal foil onto a resin film or the like, a transparent conductive thin film having a layer structure such as FTO/ITO/glass, and the like. The shape and the thickness of the negative electrode 11 and the positive electrode 12 are not particularly restricted; and known ones may be adopted.

As for the electrochemical element 20, especially when the layer 1 (i.e. the layer containing an acidic amino acid) of the solid electrolyte 10 is arranged on the negative electrode 11 side and the layer 2 (i.e. the layer containing a basic amino acid) is arranged on the positive electrode 12 side, the electrochemical element 20 can perform a rectifying function between the negative electrode and the positive electrode of the electrochemical element 20 and can conduct a large electric current only in one direction, which is thus favorable.

The electrochemical element 20 according to the present invention comprises the solid electrolyte 10 which is made of a material having high biocompatibility and which is capable of conducting a large electric current in one direction with a rectifying function. By using the electrochemical element 20 in a rectifying circuit of a device for example, it is possible to provide a device which properly serves a rectifying function and is highly safe to the living body.

EXAMPLES

Hereinafter, the solid electrolyte and the electrochemical element according to the present invention will be described in more detail based on Examples.

(Production of Solid Electrolyte and Electrochemical Element)

Figure 3:
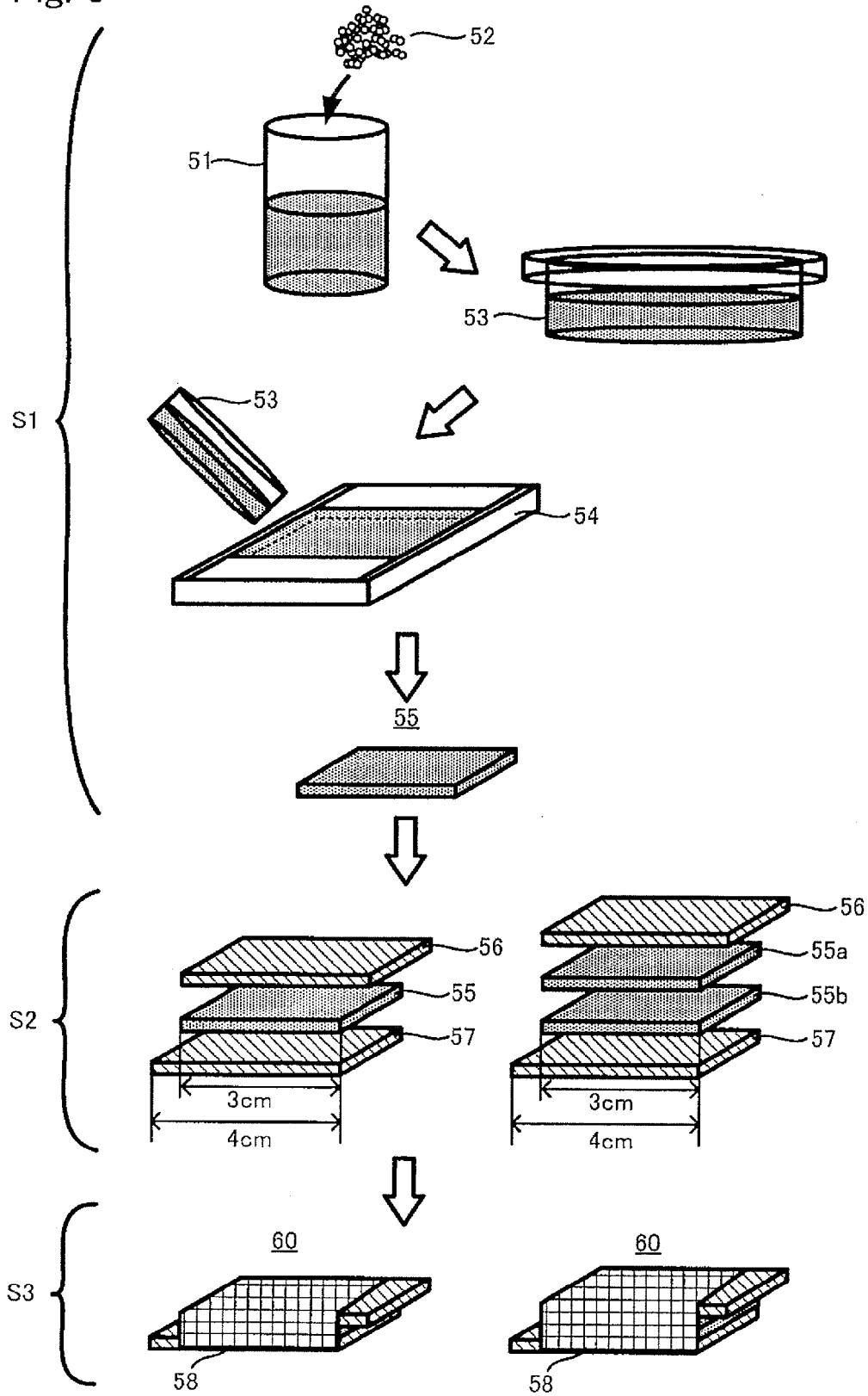
FIG. 3 is a schematic view for illustrating a production process of the solid electrolyte and the electrochemical element.

In present Examples, the solid electrolyte and the electrochemical element were produced in the following procedures. FIG. 3 shows a schematic view for illustrating the flow of the production process.

Step S1: as shown in FIG. 3, a desired amino acid was dissolved in distilled water; 10 mL of a solution with an adjusted pH was put in a container 51; a gel 52 in a solid powder form was added to the container 51 (such that a mass ratio of the distilled water to white powder of agarose (agar powder) became 100:3 (water:agarose)), to be stirred thereafter. After stirring it, the solution was transferred to a container 53, and was irradiated with a microwave by a microwave oven for 15 minutes to dissolve the gel sufficiently. After that, the solution was immediately poured into a mold 54 and gelated by air cooling. Subsequently, the gel was removed from the mold and cut into a desired size to obtain a gel body 55 as a test sample. In the gel body 55, a mass ratio of the amino acid to the gel 52 was 1:20 (amino acid:gel).

Step S2: next, the gel body 55 as a test sample was sandwiched by plate electrodes 56 and 57 made of a transparent conductive thin film (FTO/ITO/glass). There was a case when the gel body 55 consisted of one gel body of one kind and a case when it consisted of two gel bodies of two kinds (gel bodies 55a and 55b); but in either case, an adhesive or the like was not used and each layer was simply stacked with each other.

Step S3: finally, the test sample gel was fixed by a transparent insulator tape 58 made of a polymer film (polypropylene), thereby obtaining an electrochemical element 60 for evaluation which had the gel body 55 consisting of one gel body or of two gel bodies sandwiched by the electrodes 56 and 57. In the electrochemical element 60, the thickness of the transparent conductive thin film was 3 mm, and the thickness of the gel body 55 was 2 mm for each.

(Evaluation Method)

Figure 4:
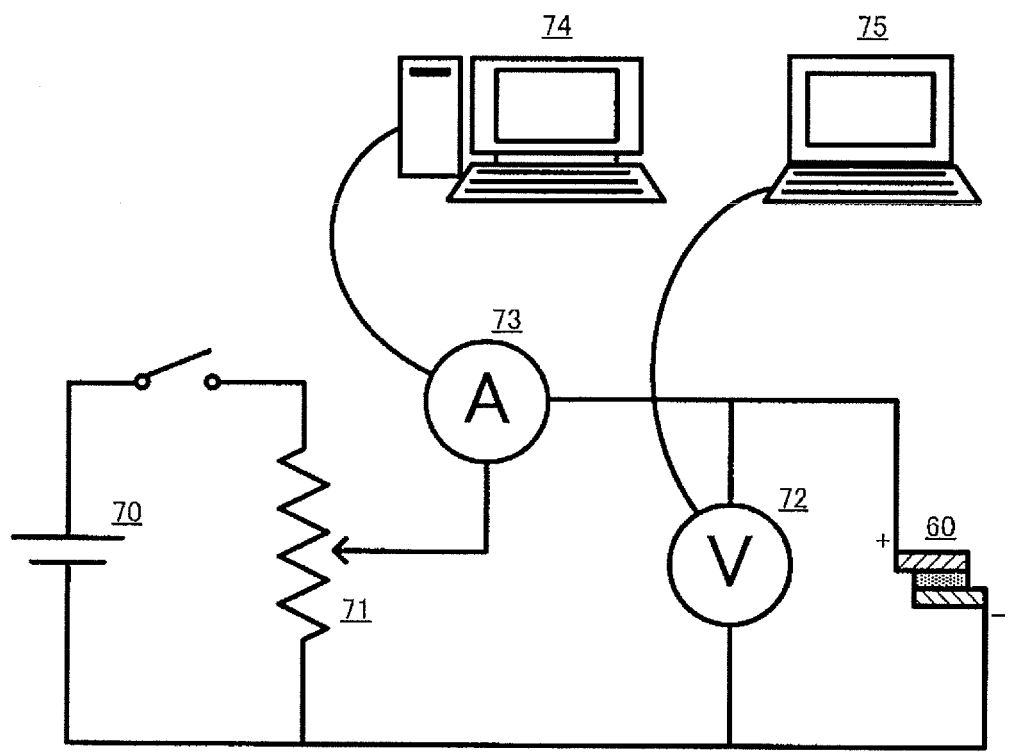
FIG. 4 is a schematic view for illustrating a testing equipment/system for the examples.

The evaluation method of the electrochemical element 60 produced will be described with reference to FIG. 4. The electrochemical element 60 produced was incorporated into a circuit as shown in FIG. 4; a direct current stabilizing power source 70 was set at about 3.7 V, and the voltage and the electric current that flows through the electrochemical element 60 were measured. First, a variable resistance 71 was varied to increase a voltage value of a tester 72 to function as a voltmeter, from 0 V by approximately every 0.5 V. A tester 73 to function as an ammeter measured a current value for 30 minutes for each voltage value. This was repeated until the voltage value reached 3.7 V. The data regarding the changes by time in the voltage and electric current thus obtained were recorded in computers 74 and 75. Evaluation results will be explained below.

Reference Example 1

Figure 5A:
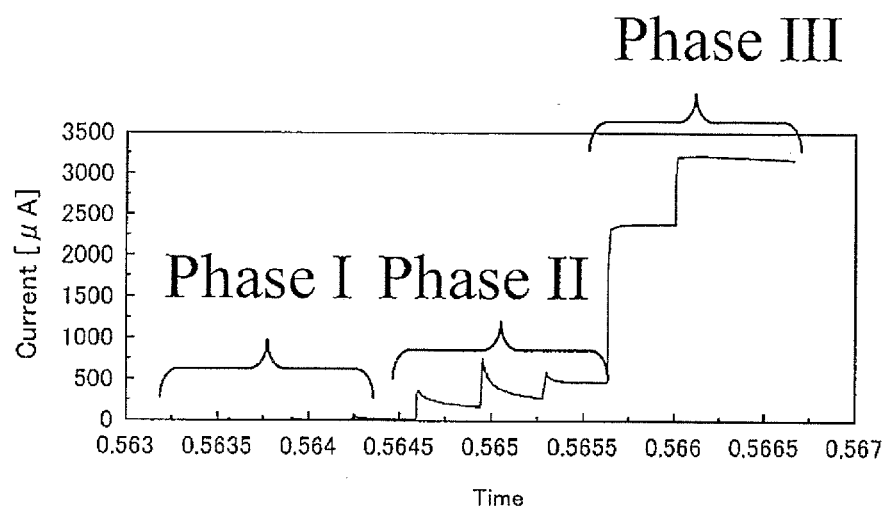
FIG. 5 is a view showing electrical characteristics in a case when one kind of agarose gel was employed as the solid electrolyte, not containing an amino acid.
Figure 5B:
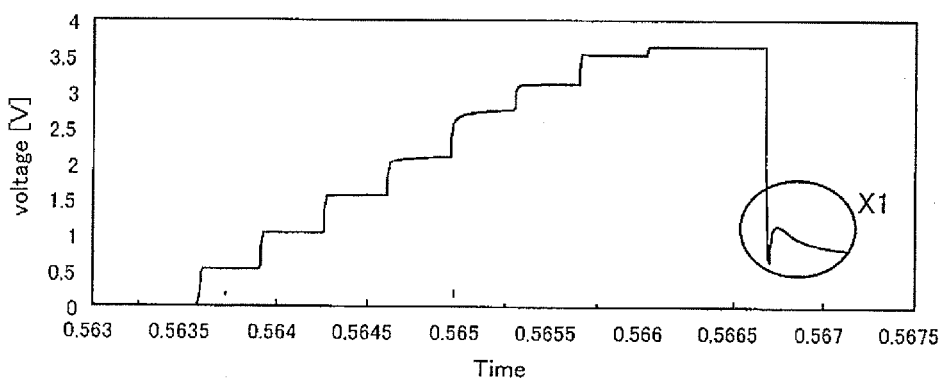
Figure 6A:
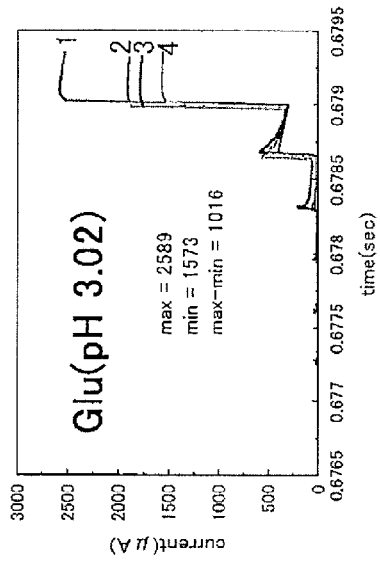
FIG. 6 is a view showing electrical characteristics for each case when each one of five acidic amino acids and neutral amino acids (asparagine acid (Asp), glutamic acid (Glu), glutamine (Gln), glycine (Gly) and proline (Pro)) was used to form a single-layer solid electrolyte.
Figure 6B:
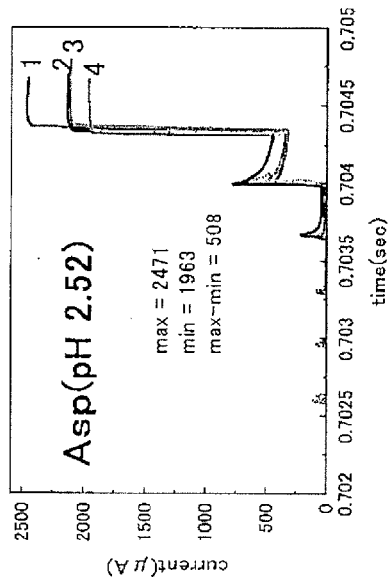
Figure 6C:
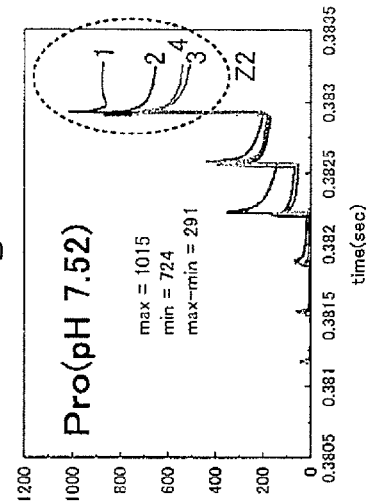
Figure 6D:
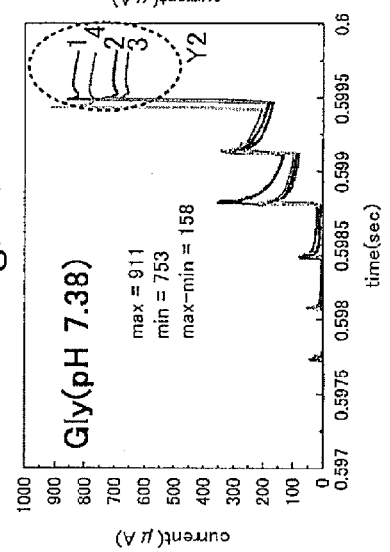
Figure 6E:
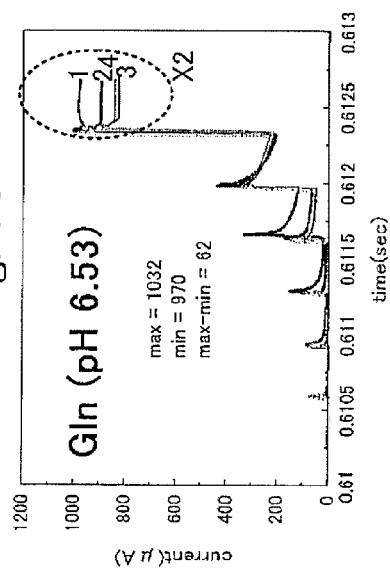
Figure 8A:
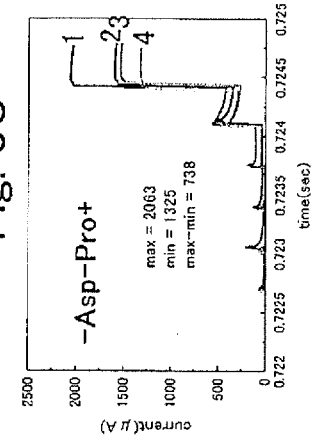
FIG. 8 is a view showing electrical characteristics for each case when asparagine acid which is an acidic amino acid and any one of three kinds of neutral acids (glutamine (Gln), glycine (Gly) and proline (Pro)) were used to form a two-layer solid electrolyte.
Figure 8B:
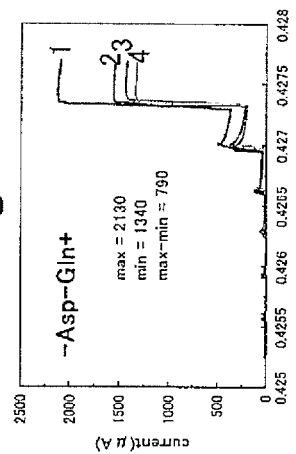
Figure 8C:
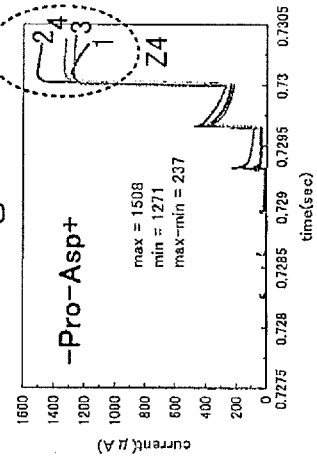
Figure 8D:
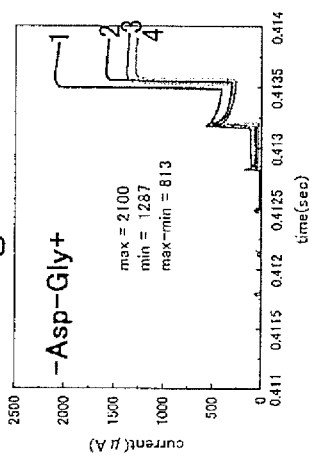
Figure 8E:
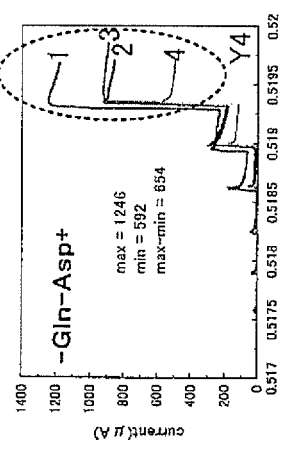
Figure 8F:
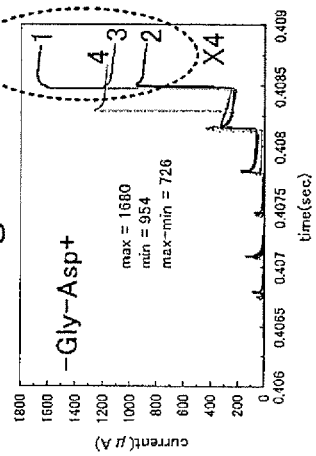

FIG. 5 shows the evaluation results in a case of providing the electrochemical element 60 with a solid electrolyte which is composed of one layer using one kind of agarose as the gel body 55, not containing an amino acid. FIG. 5A shows the results of changes by time in the current value plotted against time. FIG. 5B shows the results of the changes by time in the voltage value plotted against time. As apparent from FIG. 5A, in the electrochemical element according to Reference Example, the electric current-voltage characteristics changed in three phases that were Phase I of between 0 and 2 V, Phase II of between 2 and 3.5 V, and Phase III of between 3.5 and 3.75 V. It can be understood that in Phase I, an electric current did not flow; in Phase II, an electric current started to flow slightly; and in Phase III, a large electric current started to flow dramatically. Further, as can be seen from the region X1 in FIG. 5B, a phenomenon was observed in which an electric potential remained just after stopping applying the voltage at about 3.7 V. The reason is assumed to be as follows: in the process of ion diffusion in the gel body 55, a chemical potential tried to achieve equilibrium, thus generating an electrical field, and it took a while for the inner energy thereof to disappear. Such electrical characteristics were seen in both cases when the electric current was in the forward direction and when it was in the reverse direction since the solid electrolyte was in a one-layer structure.

Reference Example 2

FIGS. 6A to 6E show the evaluation results for each case where the electrochemical element 60 was provided with a solid electrolyte which is composed of one layer using one gel body 55 to which each one of five neutral amino acids and acidic amino acids was added. Asp refers to asparagine acid. Glu refers to glutamic acid. Gln refers to glutamine. Gly refers to glycine. Pro refers to proline. Among these, asparagine acid and glutamic acid are acidic amino acids; and glutamine, glycine and proline are neutral amino acids. As shown in FIG. 6, looking at the changes in the current value in Phase III, it can be understood that when using the gel body added with the acidic amino acid, decrease in the current value was small and the changes in the current value were also small. As opposed to this, when using the gel body added with the neutral amino acid, decrease in the current value was larger (Regions X2, Y2, and Z2 in FIG. 6), compared to the case of using the acidic amino acid.

Reference Example 3

FIGS. 7A to 7F show the evaluation results of the electrical characteristics for each case when an electrochemical element was formed by producing a two-layer solid electrolyte using glutamic acid (Glu) which is an acidic amino acid and three kinds of neutral amino acids (Gln, Gly, Pro) and disposing the solid electrolyte between the negative electrode and the positive electrode. In FIG. 7 and Examples shown hereinafter, "–(Material A)–(Material B)+" means that the gel body 55 containing Material A is provided on the negative electrode side and that the gel body 55 containing Material B is provided on the positive electrode side. As apparent from FIG. 7, every case showed similar electrical characteristics to those in the case of using one agarose gel only (Reference Example 1), and a large electric current started to flow in Phase III. Further, with respect to the electric current direction, big differences were not observed between the forward direction and the reverse direction. FIG. 7 shows the results of four evaluation tests conducted using the same gel. Slight decrease in the current value was observed, but large attenuation of the electrical characteristics was not observed. Looking at the changes in the current value in Phase III, when the neutral amino acid was arranged on the negative electrode side, there was larger decrease in the current value compared to the case of arranging it on the positive electrode side. For example, it can be seen that there was larger decrease in "–Gly–Glu+" than in "–Glu–Gly+"; larger decrease in "–Gln–Glu+" than in "–Glu–Gln+"; and larger decrease in "–Pro–Glu+" than in "–Glu–Pro+" (Regions X3, Y3, and Z3 in FIG. 7).

Reference Example 4

FIGS. 8A to 8F show the evaluation results of the electrical characteristics for each case when an electrochemical element was formed by producing a two-layer solid electrolyte using asparagine acid (Asp) which is an acidic amino acid and three kinds of neutral amino acids (Gln, Gly, Pro) and disposing the solid electrolyte between the negative electrode and the positive electrode. Every case showed similar electrical characteristics to those in the case of using one agarose gel only (Reference Example 1), and a large electric current started to flow in Phase III. Further, with respect to the electric current direction, big differences were not observed between the forward direction and the reverse direction. FIG. 8 shows the results of four evaluation tests conducted using the same gel. Larger decrease in the current value was observed (Regions X4, Y4, and Z4 in FIG. 8) compared to the case of using the above mentioned glutamic acid (Reference Example 3).

Reference Example 5

Figure 9A:
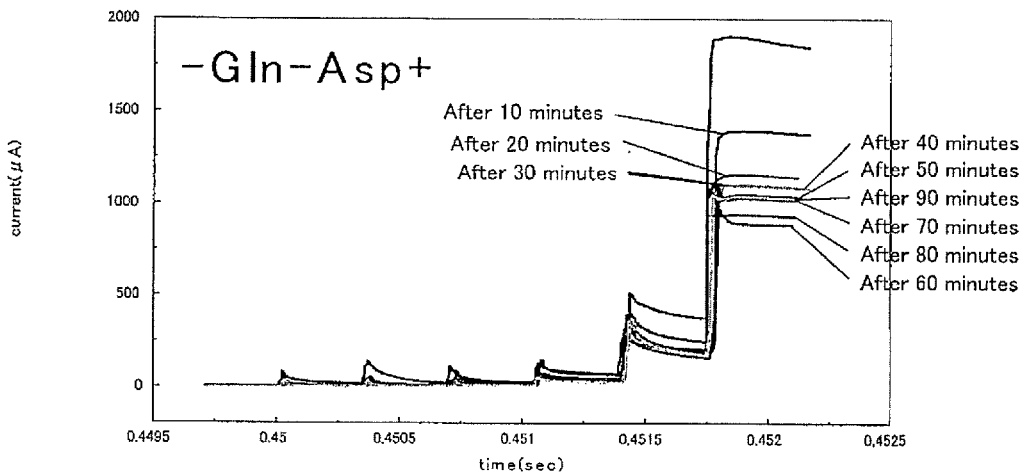
FIG. 9 is a view showing electrical characteristics in a case of forming a two-layer solid electrolyte with asparagine acid which is an acidic amino acid and glutamine which is a neutral amino acid.
Figure 9B:
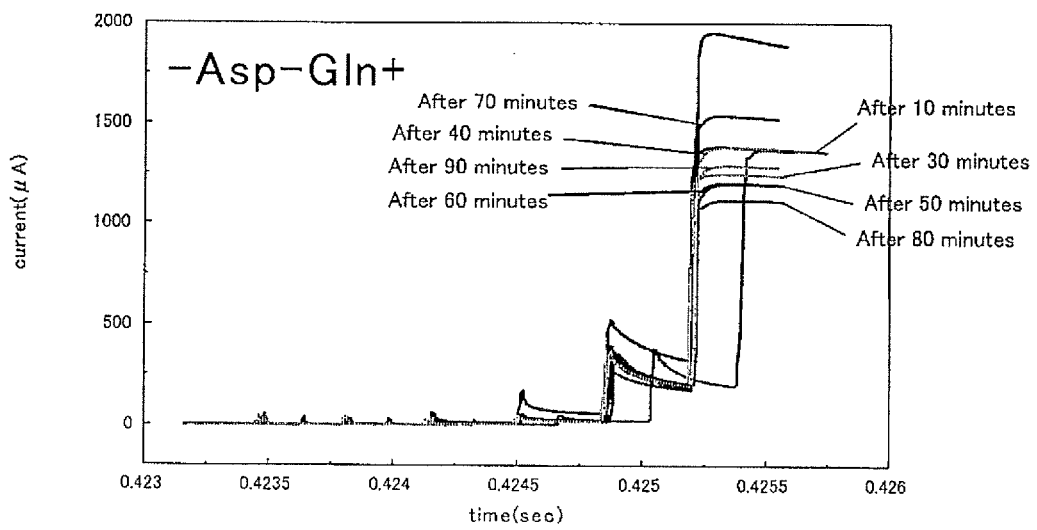

FIGS. 9A and 9B show the evaluation results of the electrical characteristics in a case of forming an electrochemical element by producing a two-layer solid electrolyte using asparagine acid (Asp) which is an acidic amino acid and glutamine (Gln) which is a neutral amino acid and disposing the solid electrolyte between the negative electrode and the positive electrode. FIG. 9 shows a relation between the elapsed time after producing the gel body 55 and the electrical characteristics. As apparent from FIG. 9, preferential differences between the negative electrode and the positive electrode were not particularly confirmed. Further, when comparing the current values in Phase III, it was found that in both cases the current values converged at a certain range of decline after a long period of time.

Example 1

Figure 10:
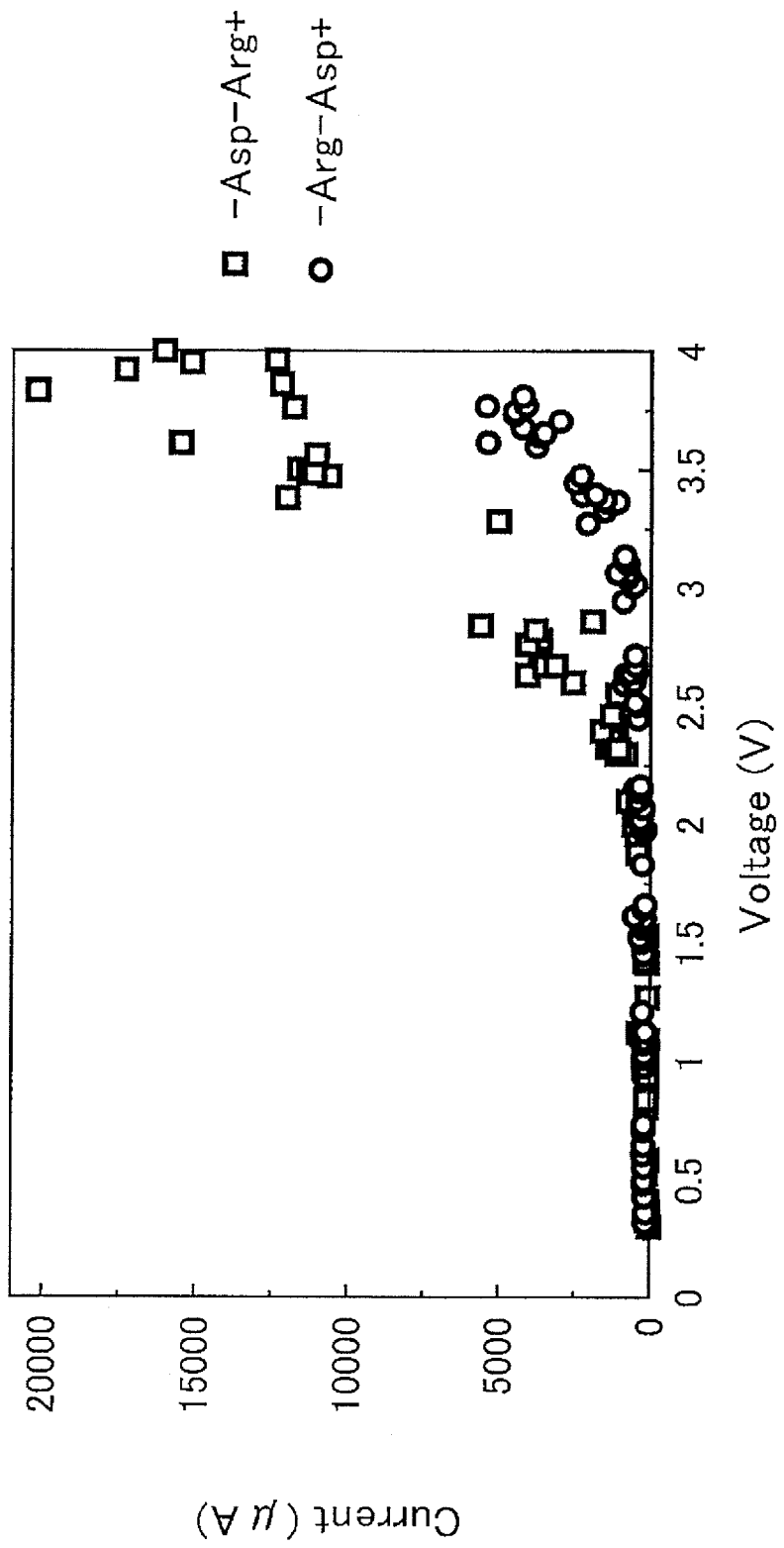
FIG. 10 is a view showing electrical characteristics in a case of forming a two-layer solid electrolyte with asparagine acid which is an acidic amino acid and arginine which is a basic amino acid.

FIG. 10 shows the evaluation results of the electrical characteristics in a case of forming an electrochemical element by producing a two-layer solid electrolyte using asparagine acid (Asp) which is an acidic amino acid and arginine (Arg) which is a basic amino acid and disposing the solid electrolyte between the negative electrode and the positive electrode. As apparent from FIG. 10, as for the case of "−Arg−Asp+", an electric current of 5000 μA was caused to flow when the voltage of 3.7 V was applied. This value was about 2.5 times higher than the current value (about 2000 ÅA) in the case of the combination of the above mentioned neutral amino acid and acidic amino acid. On the other hand, in the case of "−Asp−Arg+", an electric current as large as 20000 μA was caused to flow, which was four times higher. The differences started to be observed in Phase II (2 to 3.5 V), and the rectifying function was similar to the characteristics of a diode. It was found that especially in a range of 2 to 3 V, a favorable rectifying property was attained.

Example 2

Figure 11:
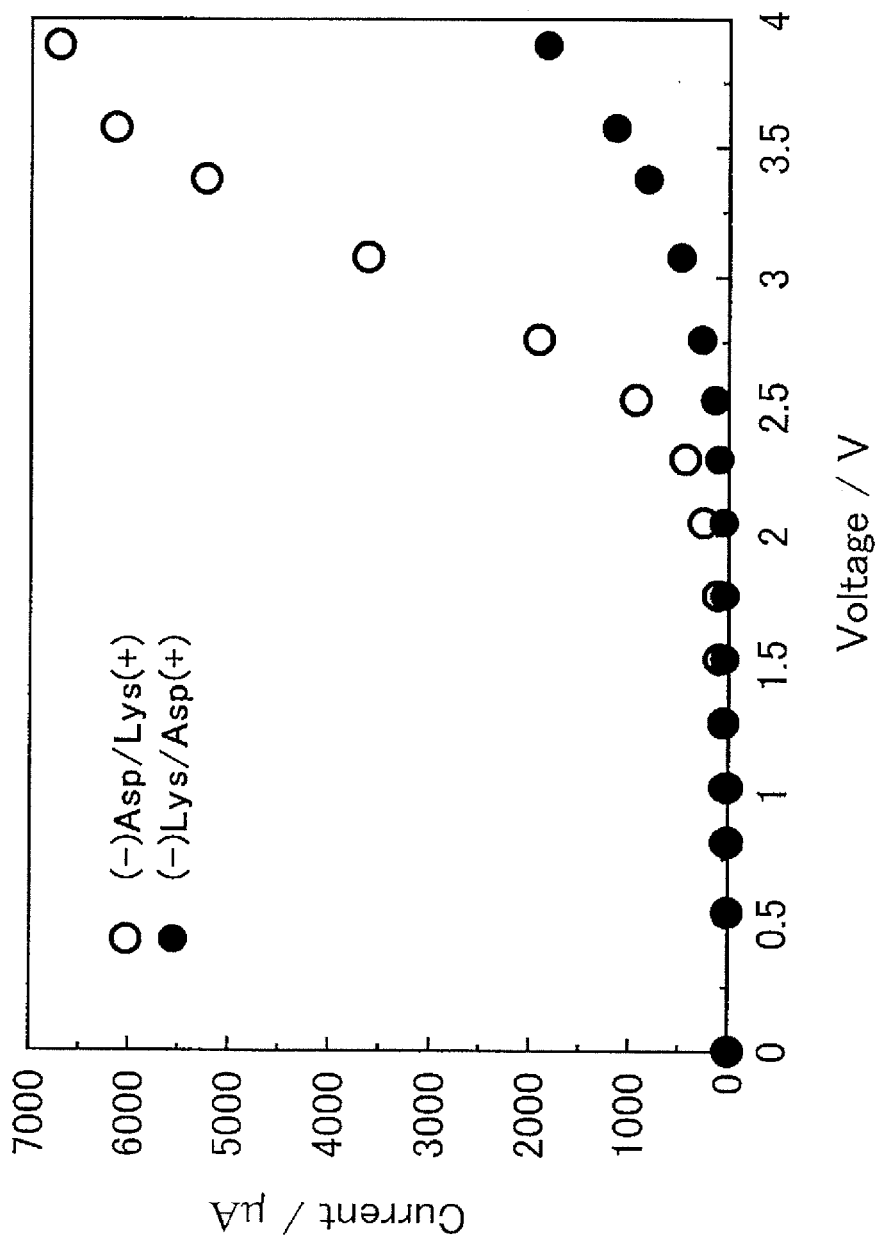
FIG. 11 is a view showing electrical characteristics in a case of forming a two-layer solid electrolyte with asparagine acid which is an acidic amino acid and lysine which is a basic amino acid.
Figure 12:
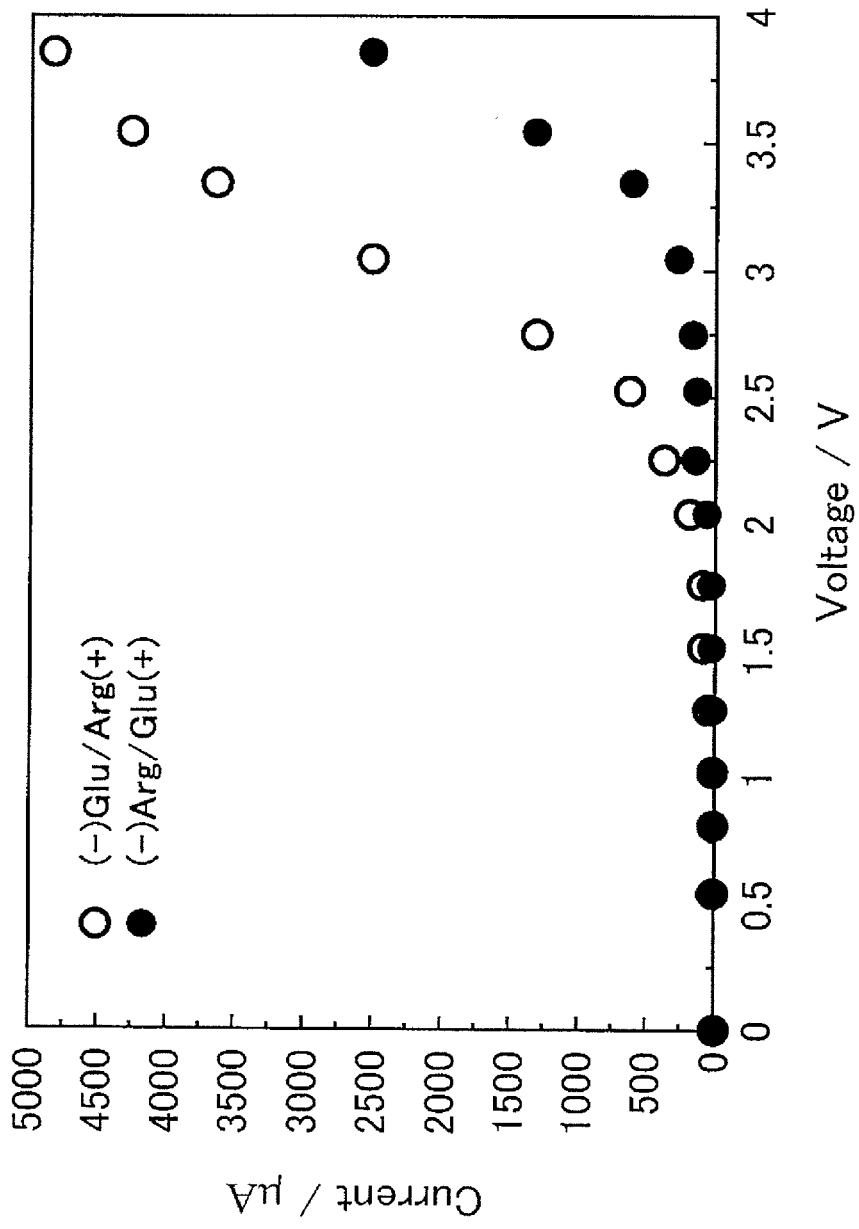
FIG. 12 is a view showing electrical characteristics in a case of forming a two-layer solid electrolyte with glutamic acid which is an acidic amino acid and arginine which is a basic amino acid.
Figure 13:
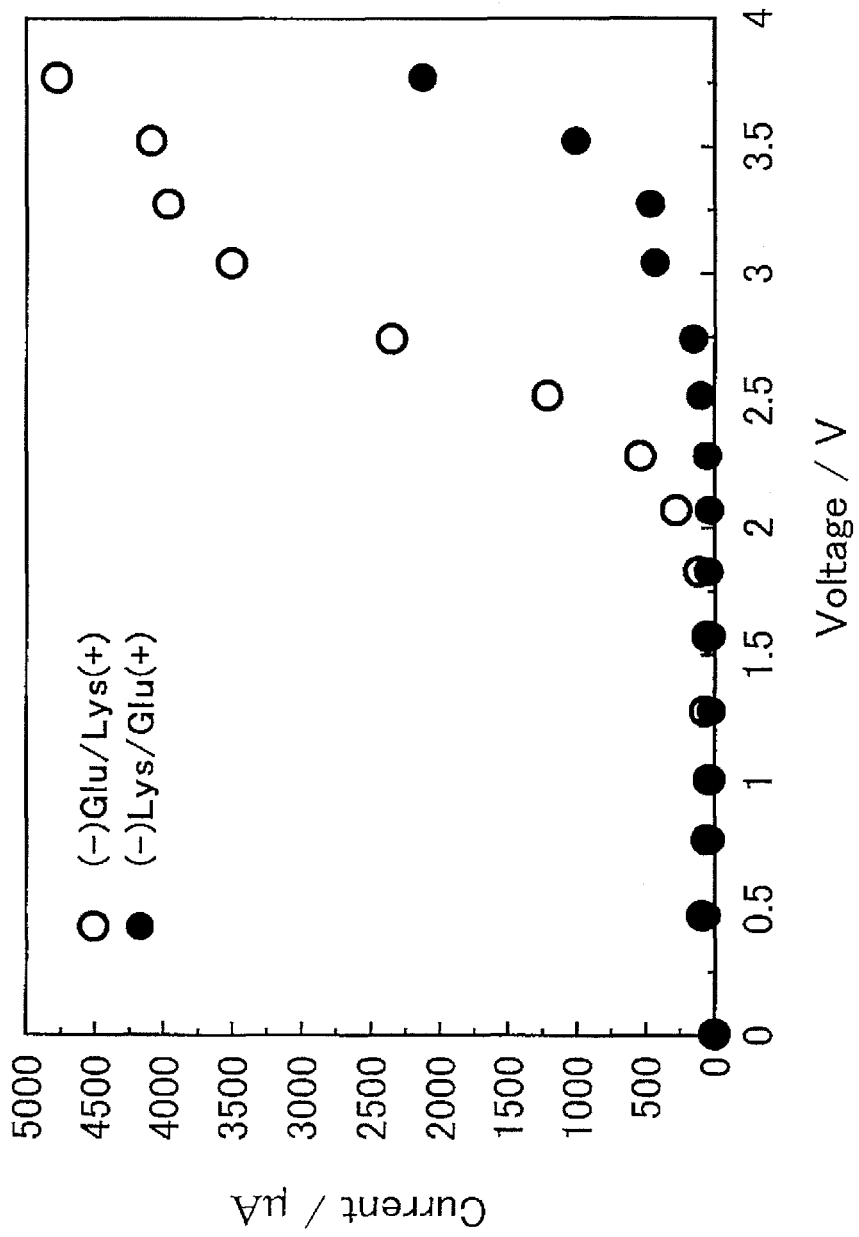
FIG. 13 is a view showing electrical characteristics in a case of forming a two-layer solid electrolyte with glutamic acid which is an acidic amino acid and lysine which is a basic amino acid.

The above rectifying function was not limited only to the combination of asparagine (Asp) which is an acidic amino acid and arginine (Arg) which is a basic amino acid. Glutamic acid is also an acidic amino acid; and lysine (Lys) is also a basic amino acid. FIGS. 11 to 13 show the evaluation results of the electrical characteristics in a case of forming an electrochemical element by producing a two-layer solid electrolyte using these and disposing the solid electrolyte between the negative electrode and the positive electrode. FIG. 11 shows the results of a combination of Asp and Lys; FIG. 12 shows the results of a combination of Glu and Arg; and FIG. 13 shows the results of a combination of Glu and Lys. As apparent from FIGS. 11 to 13, the rectifying function was confirmed in all of the cases. However, the value of an electric current caused to flow in each of the cases was found to be smaller than in the case of the combination of Asp and Arg. As to the value of the electric current, it was largest in the case of the combination of Asp and Arg; the combination of Asp and Lys showed the second largest; and the combination of Glu and Arg and the combination of Glu and Lys showed the third largest. However, when employing Glu and Lys, the rectifying function was shown to be slightly larger than that of Glu and Arg in the voltage application range of 2.5 V to 3.0 V. These comparative data as a result showed significant differences even though the concentration of the amino acid was raised higher than in the case of Asp and Arg that showed an especially large current value. Accordingly, it can be concluded that although Asp and Arg are the most suitable combination, the rectifying function can be ensured also in the case of using glutamic acid (Glu) as the acidic amino acid and lysine as the basic amino acid, even if the current value that can be obtained is low.

The present invention has been described above as to the embodiment which is supposed to be practical as well as preferable at present. However, it should be understood that the present invention is not limited to the embodiment disclosed in the specification of the present application and can be appropriately modified within the range that does not depart from the gist or spirit of the invention, which can be read from the appended claims and the overall specification, and a solid electrolyte and an electrochemical element with such modifications are also encompassed within the technical range of the invention.

For example, it has been described above that the solid electrolyte 10 contains sugar, cellulose and the like in addition to amino acids; however the present invention is not limited to this configuration. For instance, other components may be contained within the range that does not deteriorate the properties of the solid electrolyte 10; or the above mentioned sugar, cellulose, and the like may not be contained. However, in order to attain more excellent biocompatibility and a favorable rectifying property, it is preferable for the solid electrolyte 10 to be constituted by a biomaterial such as sugar and cellulose in addition to an amino acid.

Further, it has been described above that the solid electrolyte 10 is produced through the process of adding and dissolving a solid powder for constituting a gel in a solution in which an amino acid is dissolved to make a gel; however the present invention is not limited to this configuration. For example, the solid electrolyte 10 may be obtained by adding polymers or monomers to a solution in which an amino acid is dissolved to polymerize and cross-link them and thereby preparing each layer 1 and 2. Or, the solid electrolyte 10 may be constituted by arranging a mixture of powder-formed polymers or the like and an amino acid in a laminated manner (two layers), and adding thereto a pre-gelated solution to make layers 1 and 2. However, in order to produce the solid electrolyte 10 more easily and more reliably, it is preferable to produce the solid electrolyte 10 through the process of dissolving a powder in a solvent, for example, heating and dissolving a solid powder of agarose or the like in a solvent and thereafter cooling the solution to form a gel.

INDUSTRIAL APPLICABILITY

Figure 14:
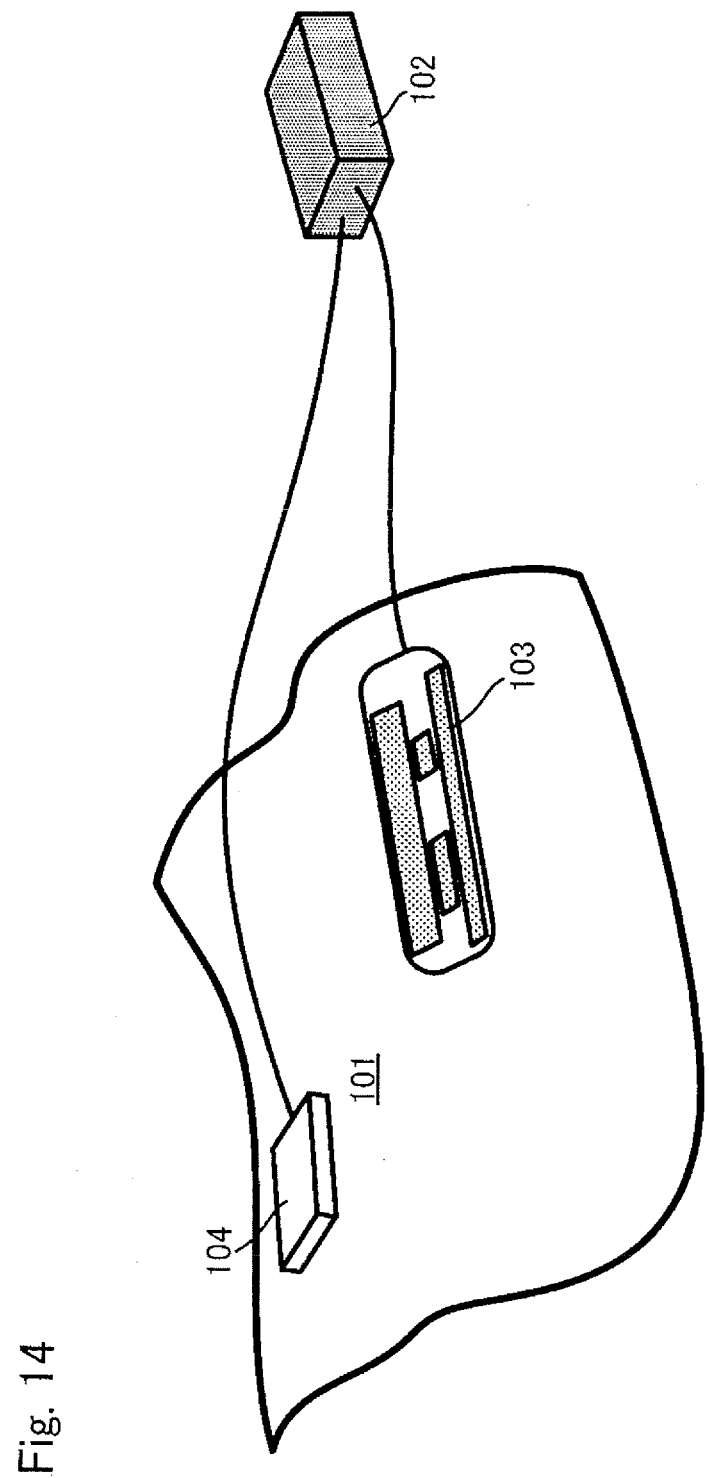
FIG. 14 is a schematic view showing one example of application of the present invention.

According to the present invention, by employing a material such as an amino acid found in a biological system, it is possible to provide a solid electrolyte which is made of a material having high biocompatibility and which has a rectifying function and can conduct a large electric current in one direction. The solid electrolyte can be applied to various kinds of electrochemical elements. For example, it can be used not only for an electrochemical element such as a diode, organic transistor, primary battery, secondary battery, wet solar cell, capacitor, electrochromic device, to be used in a chemiluminescence display device and liquid crystal display device, but also as a pad material for a bioelectrode to be used in a medical setting. For example, it can be employed as a material for an electrode bad to be used for a defibrillator and the like; an electrode material of a cardiac pacemaker; a gel pad material for a low-frequency therapy apparatus; a skin electrode material for cosmetic purposes, etc. When constituting a gel pad using the solid electrolyte according to the present invention, high detoxification effects and metabolic effects in the subcutaneous tissue by the contained amino acid can be expected. In addition, healthcare workers can design a gel pad on site in accordance with the symptoms of a patient and can easily pattern an electric current. For example, by adequately turning around the solid electrolyte according to the present invention, it can make a gel pad a part of which has a large electric current flow and another part of which has no electric current flow. FIG. 14 schematically shows an example of a case of using it as a gel pad material for a low-frequency therapy apparatus. Electrodes (an electrode 103 on the gel pad side and an electrode 104 on the other end) are attached to an area 101 such as the waist and the back, as the patient requests, with a conductive wire extending from the low-frequency therapy apparatus 102. Herein, for example, a gel composition solid electrolyte in a two-layer structure containing two kinds of amino acids that are asparagine acid and arginine is used as the gel pad. At this time, the two kinds of amino acids are absorbed into the body through the skin. Since asparagines acid added to the gel pad has an effect of promoting the synthesis of urine, it eliminates from the body to the outside the ammonia which is toxic when it remains in the body, and protects the central nerve. Therefore, it is effective in improving various symptoms regarding the peripheral nerve. On the other hand, arginine can activate immune reaction, promote cell growth, facilitate generation of collagen, etc. Further, since the amino acid that has effects of treating wound and bed sore is added to the gel pad, it is highly effective in healing an injury and can be expected to serve as a bandage that leaves almost no scars. Further, in a case of substituting arginine which is a basic amino acid with lysine, since lysine has effects of promoting recovery and growth of the tissues of the body and promoting metabolism, it can be expected to help the subcutaneous tissue recover from fatigue. In a case of substituting asparagine acid which is an acidic amino acid with glutamic acid, since it has a detoxification effect of changing ammonia into glutamine once it is in the body, and since it has effects of promoting excretion of urine, alleviating fatigue and promoting healing of ulcer, it can be expected to help the subcutaneous tissue recover from fatigue. In this way, these acidic amino acids and basic amino acids can be expected of good effects when taken into the body. In addition, since the solid electrolyte according to the present invention has a rectifying function, it can be employed in a rectifying circuit in various devices.

The invention claimed is:

1. A rectifier device comprising a solid electrolyte, wherein the solid electrolyte comprises a first layer containing an acidic amino acid and a second layer containing a basic amino acid,
   wherein both the acidic amino acid and the basic amino acid are mono-amino acid and the first layer and the second layer are stacked on each other.

2. The rectifier device according to claim 1, wherein both the first layer and the second layer are gelatinous.

3. The rectifier device according to claim 1, wherein the acidic amino acid is asparagine acid or glutamic acid.

4. The rectifier device according to claim 1, wherein the basic amino acid is arginine or lysine.

5. The rectifier device according to claim 1, wherein the solid electrolyte contains sugar and/or cellulose in addition to the amino acid.

6. The rectifier device according to claim 1, further comprising: a positive electrode and a negative electrode, wherein the solid electrolyte is disposed between the positive electrode and the negative electrode.

7. The rectifier device according to claim 6, wherein the first layer is disposed on the negative electrode side, and the second layer is disposed on the positive electrode side.

8. A diode comprising the rectifier device according to claim 1.

9. An electrode pad comprising the rectifier device according to claim 1.

10. A method of current rectification comprising the step of applying electrical current through a solid electrolyte,
    wherein the solid electrolyte comprises a first layer containing an acidic amino acid and a second layer containing a basic amino acid,
    wherein both the acidic amino acid and the basic amino acid are mono-amino acid and
    the first layer and the second layer are stacked on each other.

* * * * *